(12) United States Patent
Yoo et al.

(10) Patent No.: US 8,716,793 B2
(45) Date of Patent: May 6, 2014

(54) LATERAL DOUBLE DIFFUSED METAL OXIDE SEMICONDUCTOR DEVICE AND METHOD FOR MANUFACTURING THE SAME

(75) Inventors: Jae Hyun Yoo, Seoul (KR); Jong Min Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 115 days.

(21) Appl. No.: 13/410,905

(22) Filed: Mar. 2, 2012

(65) Prior Publication Data
US 2013/0075816 A1 Mar. 28, 2013

(30) Foreign Application Priority Data
Sep. 23, 2011 (KR) .................. 10-2011-0096334

(51) Int. Cl.
*H01L 29/78* (2006.01)
(52) U.S. Cl.
USPC .......... 257/341; 257/339; 257/342; 257/343; 257/345; 257/391; 257/401; 257/404; 257/E29.256; 257/E21.417; 257/E29.261; 257/E29.053; 438/286
(58) Field of Classification Search
USPC ......... 257/339, 341, 342, 343, 345, 391, 401, 257/404, E29.256, E21.417, E29.261, 257/E29.053
See application file for complete search history.

(56) References Cited

U.S. PATENT DOCUMENTS

| 7,714,407 B2 | 5/2010 | Udrea et al. |
| 7,960,786 B2 | 6/2011 | Huang et al. |
| 2010/0006935 A1* | 1/2010 | Huang et al. .................. 257/341 |
| 2010/0163989 A1 | 7/2010 | Tu et al. |

FOREIGN PATENT DOCUMENTS

KR 10-2010-0063576 6/2010

* cited by examiner

*Primary Examiner* — Matthew W Such
*Assistant Examiner* — David Spalla
(74) *Attorney, Agent, or Firm* — Sherr & Jiang, PLLC

(57) ABSTRACT

Disclosed are an LDMOS device and a method for manufacturing the same capable of decreasing the concentration of a drift region between a source finger tip and a drain, thereby increasing a breakdown voltage. An LDMOS device includes a gate which is formed on a substrate, a source and a drain which are separately arranged on both sides of the substrate with the gate interposed therebetween, a field oxide film which is formed to have a step between the gate and the drain, a drift region which is formed of first condition type impurity ions between the gate and the drain on the substrate, and at least one internal field ring which is formed inside the drift region and formed by selectively ion-implanting second conduction type impurity ions in accordance with the step of the field oxide film.

19 Claims, 5 Drawing Sheets

LATERAL DOUBLE DIFFUSED METAL OXIDE SEMICONDUCTOR DEVICE AND METHOD FOR MANUFACTURING THE SAME

The present application claims priority to Korean Patent Application No. 10-2011-0096334 (filed on Sep. 23, 2011), which is hereby incorporated by reference in its entirety.

BACKGROUND

An LDMOS transistor which is used in a high-voltage power device has advantages of fast switching speed, high input impedance, low power consumption, and compatibility with a CMOS process, and is widely used in various power devices including a display driving IC, a power converter, a motor controller, and a power supply for a vehicle. In the case of a power device, since on-resistance and breakdown voltage are important factors which significantly affects the device performance, various techniques have been suggested so as to increase the breakdown voltage while maintaining on-resistance Rsp.

For example, a structure has been suggested in which an internal field ring made of a dopant of a type opposite to a drift region is formed below the gate end portion in the drift region of the LDMOS transistor.

On the other hand, the breakdown voltage characteristic of the semiconductor device is closely related to the radius of curvature of a source region or a drain region. In particular, the radius of curvature of the relatively small source region is one of the main factors which may cause a decrease in the breakdown voltage of the device, due to an electric field concentration phenomenon occurring in a junction area having a small radius of curvature.

FIG. 1 is a layout view of a power semiconductor device of the related art, for example, an LDMOS transistor. FIG. 2 is a sectional view taken along the line of FIG. 1. In FIGS. 1 and 2, the same reference numerals represent the same regions or layers.

As illustrated in FIGS. 1 and 2, the LDMOS transistor of the related art includes a source 10, a drain 20, a source-side protrusion 10', a drain-side protrusion 20', a gate 30, and an N drift region 40. The drain 20 is separated from the source 10 at a predetermined interval.

The source 10 includes a source electrode on the surface of a p-type semiconductor substrate 1 and is a highly doped n+ type source region formed in the semiconductor substrate 1 below the source electrode.

The drain 20 includes a drain electrode on the surface of the semiconductor substrate 1 and an N drift region 40 formed in the semiconductor substrate 1 below the drain electrode. The N drift region 40 is an n-well region formed by an n-type impurity ion implantation process.

As illustrated in FIG. 2, the drain 20 is an n+ type drain region formed inside the N drift region 40. A p-type top region 25 is formed inside the N drift region 40.

The gate 30 is formed so as to be insulated from an underlying channel region by a gate insulating film 50, and the source electrode, the drain electrode, and a gate electrode are insulated from each other by an insulating interlayer.

The LDMOS transistor also includes a field oxide film 42 having a LOCOS structure.

The semiconductor having the LDMOS transistor of the related art analyzes the ratio of the number of electric charges in the layout corresponding to the N drift region 40 and the P-type top region 25 to obtain the optimum conditions of the breakdown voltage and the on-resistance.

In the case of an LDMOS which is used in a high-voltage application, from the viewpoint of design layout, there is a phenomenon that the charge balance is lost depending on the boundary condition. That is, in a source finger structure in which a round is formed on the basis of the source 10 or a drain finger structure in which a round is formed on the basis of the drain 20, there is a phenomenon that the optimum breakdown voltage characteristic decreases. In particular, in the case of an n-type LDMOS, it is more difficult to ensure the breakdown voltage characteristic, having a limit to ensure the breakdown voltage due to the corner effect. In general, in order to correct the phenomenon that the breakdown voltage of the n-type LDMOS is limited, a method is used in which the n-type LDMOS of the corner region is not taken into consideration, or a method is used in which the n-type LDMOS characteristic is taken into consideration but limitedly used.

According to these methods, there is a phenomenon that the device characteristic per cross-sectional area of the LDMOS is not ensured. Accordingly, there is demand for a method capable of ensuring the optimum LDMOS characteristic per given size.

SUMMARY

Embodiments relate to a semiconductor and manufacturing a semiconductor device, and in particular, to an LDMOS device and a method for manufacturing the same capable of increasing a breakdown voltage and optimizing an on-resistance characteristic without causing an increase in the radius of curvature in a corner region.

In accordance with embodiments, there is provided an LDMOS device and a method for manufacturing the same capable of performing separate ion implantation processes in a strip region and a corner region of a drift region, and forming an internal field ring in the corner region by n-type impurity and p-type impurity implantation processes, thereby optimizing on-resistance and breakdown voltage characteristics.

Embodiments are not limited to those mentioned herein, and other embodiments will be apparently understood by those skilled in the art through the following description.

In accordance with embodiments, there is provided an LDMOS device. The LDMOS device may include a gate which is formed on a substrate, a source and a drain which are separately arranged on sides of the substrate with the gate interposed therebetween, a field oxide film which is formed between the gate and the drain, a drift region which is formed between the gate and the drain using first condition type impurity ions with respect to a strip region, and a plurality of internal field rings which are formed of first and second condition type impurity ions inside a corner region having the fingertip of the source and the fingertip of the drain, and are coupled to each other. Each of the internal field rings includes a region formed of the second condition type impurity ions inside a region formed of the first condition type impurity ions.

The LDMOS device may further include a top region which is formed of the second condition type impurity ions below the field oxide film, and the internal field rings may be formed below the top region.

The concentration of the corner region may be determined by the number of internal field rings.

The concentration of the corner region may be determined by the ion implantation amount or implantation energy of the second conduction type impurity ions for forming the internal field rings.

The internal field rings may have a plurality of first internal rings which are formed of the first condition type impurity ions and are coupled to each other in a polygonal shape, and a plurality of second internal rings which are respectively formed inside the first internal rings and are formed of the second condition type impurity ions to have a polygonal shape.

The first internal rings may be formed to have a hexagonal shape and coupled to each other in a honeycomb structure.

In accordance with embodiments, there is provided a method for manufacturing an LDMOS device which has a source and a drain separately arranged on sides of a substrate with a gate interposed therebetween. The method may include implanting first condition type impurity ions on the substrate corresponding to a strip region excluding a corner region having the fingertip of the source and the fingertip of the drain to form a drift region, forming a field oxide film on the substrate corresponding to the corner region, and implanting the first and second condition type impurity ions in the corner region to form a plurality of internal field rings coupled to each other. Each of the internal field rings may include a region formed of the second conduction type impurity ions inside a region formed of the first conduction type impurity ions.

The method may further include, prior to forming the internal field rings, implanting the second condition type impurity ions below the field oxide film to form a top region. The internal field rings may be formed below the top region.

In the method, the forming the internal field rings may include performing a process for implanting the first condition type impurity ions using an ion implantation mask, in which a portion of the corner region is exposed, to form a plurality of first internal rings coupled to each other in a polygonal shape, and performing a process for implanting the second condition type impurity ions using an ion implantation mask, in which another portion of the corner region exposed is exposed, to form a plurality of second internal rings in a polygonal shape inside the first internal rings.

In the method, in the forming the first internal rings, the first internal rings may be formed to have a hexagonal shape and coupled to each other in a honeycomb structure.

In accordance with embodiments, it is possible to perform separate ion implantation processes in the strip region and the corner region of the drift region and to form the internal field rings in the corner region by the n-type and p-type impurity ion implantation processes, thereby increasing the breakdown voltage without causing an increase in the radius of curvature of the corner region, and optimizing the on-resistance characteristic.

DRAWINGS

The objects and features of the present invention will become apparent from the following description of embodiments given in conjunction with the accompanying drawings, in which.

Figure 1:
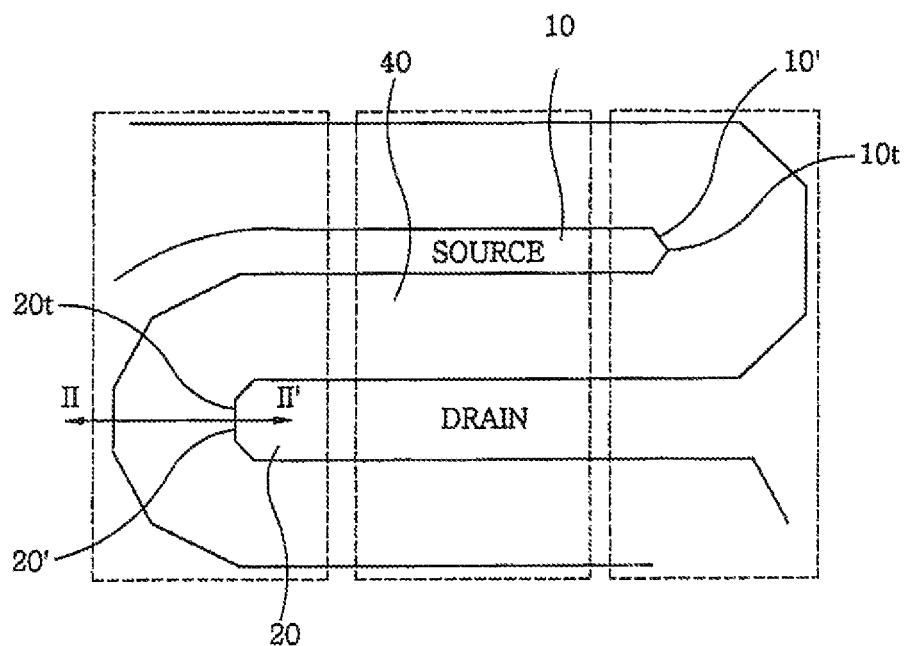
FIG. 1 is a layout view illustrating an LDMOS transistor as a power semiconductor device of the related art.
Figure 2:
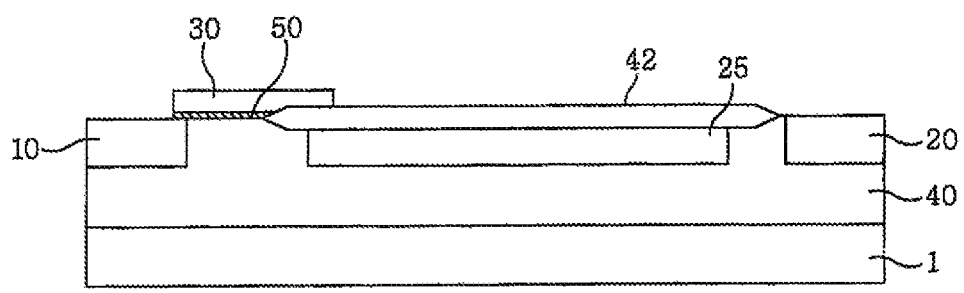
FIG. 2 is a sectional view taken along the line II-II' of FIG. 1.
Figure 3:
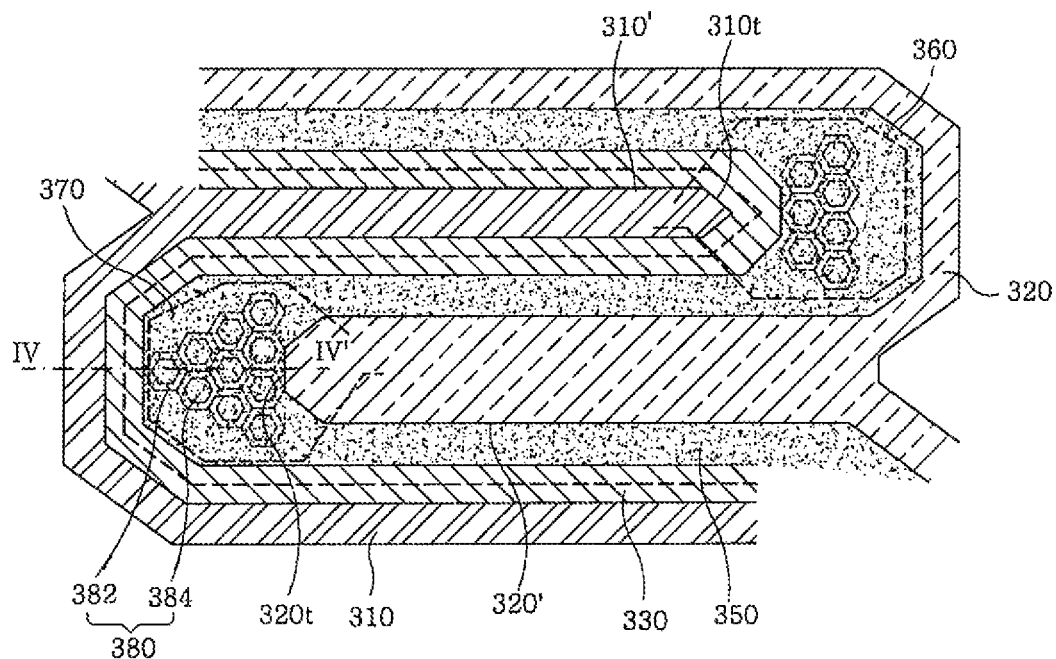

Example FIG. 3 is a layout view illustrating an LDMOS device in accordance with embodiments.

Figure 4:
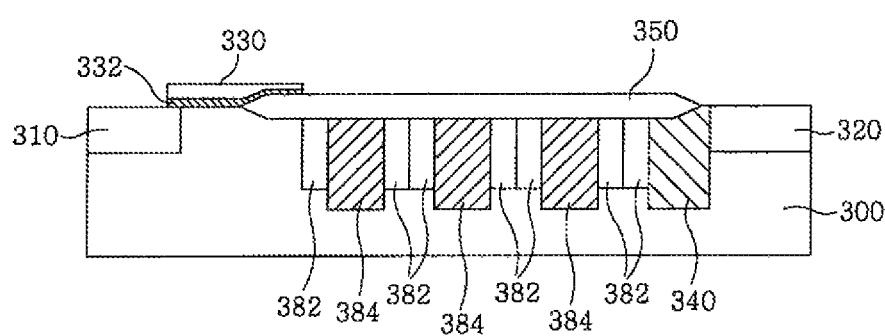

Example FIG. 4 is a sectional view taken along the line IV-IV' of example FIG. 3.

Figure 5A:
Figure 5B:
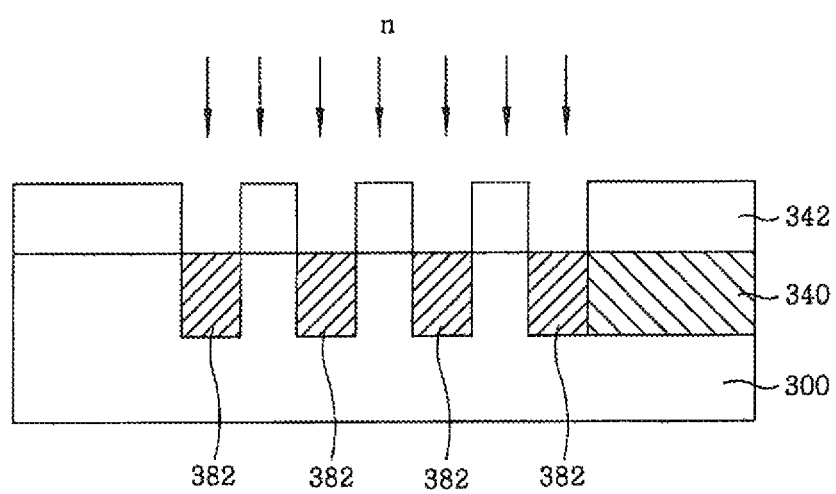
Figure 5C:
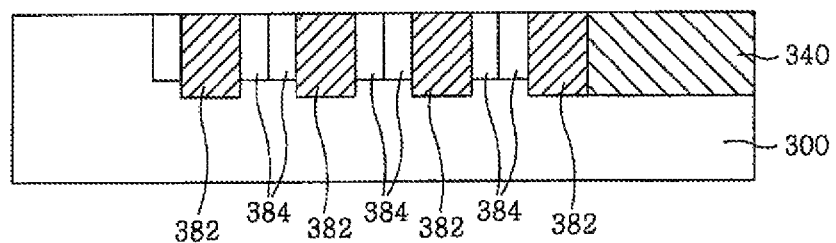

Example FIGS. 5A to 5C are process sectional views illustrating a process of forming internal field rings in the LDMOS device in accordance with embodiments.

Figure 6:
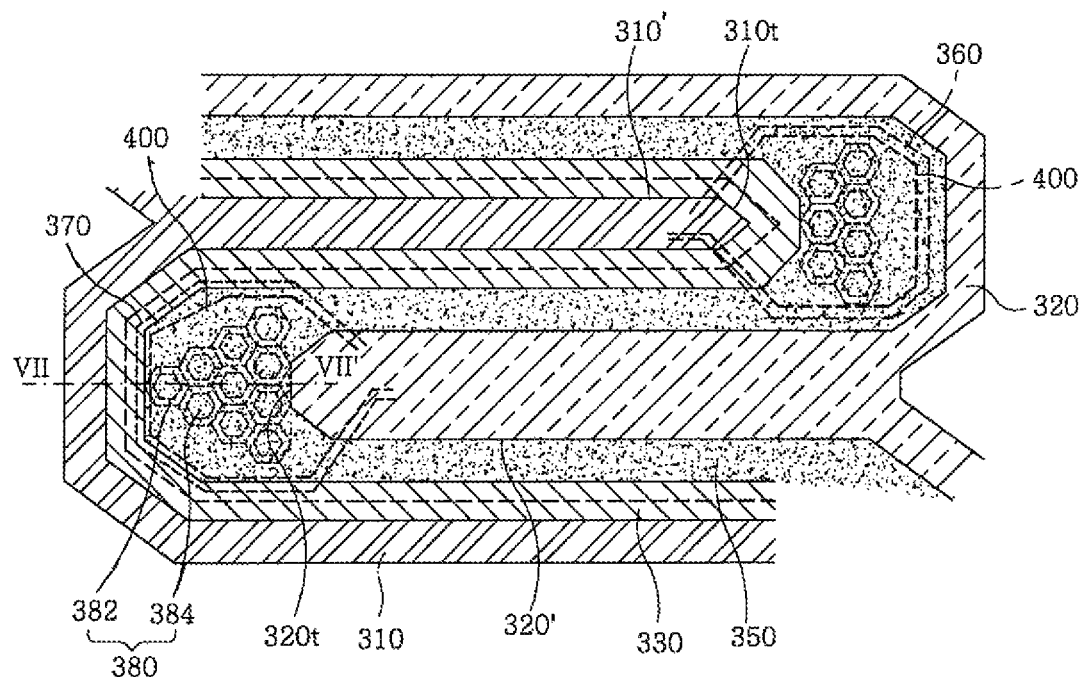

Example FIG. 6 is a layout view illustrating an LDMOS device in accordance with embodiments.

Figure 7:
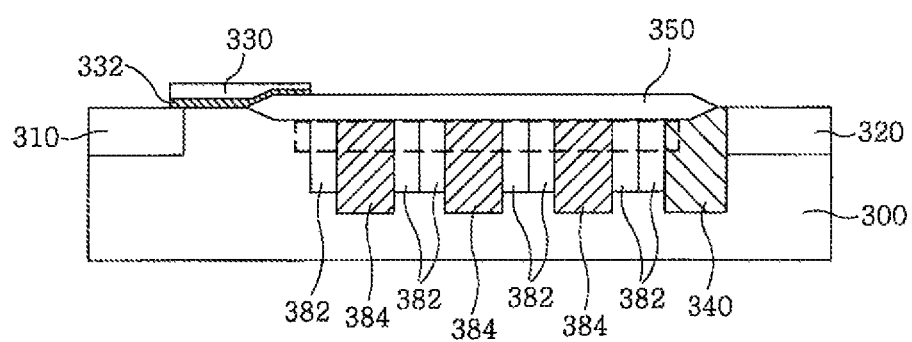

Example FIG. 7 is a sectional view taken along the line VII-VII' of FIG. 6.

Example FIGS. 8A to 8D are process sectional views illustrating a process of forming internal field rings in the LDMOS device in accordance with embodiments.

DESCRIPTION

Advantages and features of the invention and methods of accomplishing the same may be understood more readily by reference to the following detailed description of embodiments and the accompanying drawings. The invention may, however, be embodied in many different forms and should not be construed as being limited to the embodiments set forth herein. Rather, these embodiments are provided so that this disclosure will be more readily understood by those skilled in the art, and the invention will only be defined by the appended claims. Like reference numerals refer to like elements throughout the specification.

Hereinafter, an n-channel LDMOS transistor according to embodiments which has a small radius of curvature in a source and can increase a breakdown voltage will be described with reference to the accompanying drawings.

Example FIG. 3 is a layout view illustrating an LDMOS device according to embodiments. Example FIG. 4 is a sectional view taken along the line IV-IV' of example FIG. 3. In Example FIGS. 3 and 4, the same reference numerals represent the same regions or layers.

Referring to example FIGS. 3 and 4, the LDMOS device according to embodiments includes a p-type substrate or a p-type SOI substrate 300, a source 310, a drain 320, a source-side protrusion 310', a drain-side protrusion 320', a gate 330, and an N drift region 340 which is formed in the p-type substrate or the p-type SOI substrate 300 and used as a drift region of the LDMOS device. Here, the drain 320 is separated from the source 310 at a predetermined interval.

The source 310 may include a source electrode on the surface of the substrate 300 and may be a highly doped n+ type source region formed in the substrate 300 below the source electrode.

The drain 320 may include a drain electrode on the surface of the substrate 300 and may be an n+ type drain region formed in the substrate 300 below the drain electrode.

The gate 330 may be formed to be insulated from an underlying channel region by a gate insulating film 332, and a gate electrode may be formed at the upper part of the gate 330 to apply a voltage to the gate 330.

The LDMOS device may also include a field oxide film 350 having a LOCOS structure. In embodiments, the field oxide film 350 may be generated by an oxidation process. For example, a LOCOS (LOCal Oxidation of Silicon) oxide film may be exemplified.

In embodiments, a source 310 and a drain 320 may respectively include source and drain fingertips 310$t$ and 320$t$ having a protrusion shape at the center thereof.

In the LDMOS device having the above-described structure, there is an electric field concentration phenomenon in the N drift region 340 between the source fingertip 310$t$ and the drain 320 and between the drain fingertip 320$t$ and the source 310, that is, in the corner regions, causing a breakdown current. In order to prevent the breakdown current, in embodiments, internal field rings 380 are formed in a first corner region 360 between the source fingertip 310$t$ and the drain 320 and a second corner region 370 between the drain fingertip 320t and the source 310 to control the doping concentration.

The internal field rings 380 may be formed of a p-type impurity and an n-type impurity in the first and second corner regions 360 and 370. The internal field rings 380 may have a plurality of first internal rings 382 which may be formed of the n-type impurity to have a polygonal shape, and a plurality of second internal rings 384 which may be formed of the p-type impurity to have a polygonal shape.

The first internal rings 382 of the internal field rings 380 may be coupled to each other and formed in an octagonal shape.

In the LDMOS device in accordance with embodiments, the N drift region 340 is formed only in a portion excluding portions where the internal field rings 380 will be formed, that is, a portion excluding the first and second corner regions 360 and 370. That is, the N drift region 340 may be formed in the portion (strip region) excluding the first and second corner regions 360 and 370, in which the internal field rings 380 will be formed, through a high-concentration n-type impurity ion implantation process, and the internal field rings 380 may then be formed in the first and second corner regions 360 and 370 through an n-type impurity ion implantation process and a p-type impurity ion implantation process.

In embodiments, the internal field rings 380 may be coupled to each other in a honeycomb structure and formed below the field oxide film 350.

As described above, the internal field rings 380 may be formed between the source fingertip 310t and the drain 320 and between the drain fingertip 320t and the source 310. Therefore, it is possible to increase the breakdown voltage without causing an increase in the radius of curvature between the source fingertip 310t and the drain 320 and between the drain fingertip 320t and the source 310, and to optimize the on-resistance characteristic.

A process of forming the internal field rings will be described with reference to example FIGS. 5A to 5C.

Example FIGS. 5A to 5C are process sectional views illustrating a process of forming internal field rings according to embodiments.

As illustrated in example FIG. 5A, first, a high-concentration n-type impurity ion implantation process is performed to form the N drift region 340 of the LDMOS device in the p-type substrate or the p-type SOI substrate 300. Specifically, an ion implantation mask in which a portion of the N drift region 340 corresponding to the strip region is exposed is formed on the substrate 300, and the high-concentration n-type impurity ion implantation process is performed to form the N drift region 340 in the substrate 300. The strip region may mean the portion excluding the portion where the field oxide film 350 will be formed, that is, the portion excluding the first and second corner regions 360 and 370.

Next, as illustrated in example FIG. 5B, a first ion implantation mask 342 in which a portion excluding the N drift region 340, that is, a portion of the first and second corner regions 360 and 376 is exposed is formed, and a high-concentration n-type impurity ion implantation process is then performed using the first ion implantation mask 342 to form the n-type first internal rings 382. The first internal rings 382 are formed in the first and second corner regions 360 and 370 and are coupled to each other in an octagonal shape.

Next, after the first ion implantation mask 342 is removed, a second ion implantation mask in which another portion of the first and second corner regions 360 and 370 is exposed is formed, and a high-concentration p-type impurity ion implantation process is performed using the second ion implantation mask to form the p-type second internal rings 384. Next, the second ion implantation mask is removed. The second internal rings 384 are formed inside the first internal rings 382 to have an octagonal shape, similarly to the first internal rings 382.

The breakdown voltage of the LDMOS device in accordance with embodiments can be controlled by adjusting the depth and width of the second internal rings 384 inside the internal field rings 380. The depth and width of the second internal rings 384 can be adjusted by adjusting the ion implantation amount and ion implantation energy in the p-type impurity ion implantation process.

Example FIG. 6 is a layout view illustrating an LDMOS device according to embodiments. Example FIG. 7 is a sectional view taken along the line VII-VII' of FIG. 6. In example FIGS. 6 and 7, the same reference numerals represent the same regions or layers.

Referring to example FIGS. 6 and 7, the LDMOS device according to embodiments includes a p-type substrate or a p-type SOI substrate 300, a source 310, a drain 320, a source-side protrusion 310', a drain-side protrusion 320', a gate 330, an N drift region 340 which is formed in the p-type substrate or the p-type SOI substrate 300 and used as a drift region of the LDMOS device, and a P top region 400. Here, the drain 320 is separated from the source 310 at a predetermined interval.

The source 310 may include a source electrode on the surface of the substrate 300 and may be a highly doped n+ type source region formed in the substrate 300 below the source electrode.

The drain 320 may include a drain electrode on the surface of the substrate 300 and may be an n+ type drain region formed in the substrate 300 below the drain electrode.

The gate 330 may be formed to be insulated from an underlying channel region by a gate insulating film 332, and a gate electrode may be formed at the upper part of the gate 330 to apply a voltage to the gate 330.

The LDMOS device may also include a field oxide film 350 having a LOCOS structure. In embodiments, the field oxide film 350 may be generated by an oxidation process. For example, a LOCOS (LOCal Oxidation of Silicon) oxide film may be exemplified. The P top region 400 may be formed through a p-type impurity ion implantation process and formed below the field oxide film 350.

In embodiments, a source 310 and a drain 320 may respectively include source and drain fingertips 310t and 320t having a protrusion shape at the center thereof.

In the LDMOS device having the above-described structure, there is an electric field concentration phenomenon in the N drift region 340 between the source fingertip 310t and the drain 320 and between the drain fingertip 320t and the source 310, causing a breakdown current. In order to prevent the breakdown current, in embodiments, internal field rings 380 are formed in a first corner region 360 between the source fingertip 310t and the drain 320 and a second corner region 370 between the drain fingertip 320t and the source 310 to control the doping concentration. The internal field rings 380 may be formed of a p-type impurity and an n-type impurity after the P top region 400 is formed. The internal field rings 380 may have a plurality of first internal rings 382 which may be formed of the n-type impurity to have a polygonal shape, and a plurality of second internal rings 384 which may be formed of the p-type impurity to have a polygonal shape.

The first internal rings 382 of the internal field rings 380 may be coupled to each other and formed in an octagonal shape.

In the LDMOS device in accordance with embodiments, the N drift region 340 is formed only in a portion excluding the portions where the internal field rings 380 will be formed, that is, a portion excluding the first and second corner regions 360 and 370, for example, the strip region. That is, the N drift region 340 may be formed in the portion excluding the first and second corner regions 360 and 370, in which the internal field rings 380 will be formed, through a high-concentration n-type impurity ion implantation process. Subsequently, the P top region 400 may be formed in the first and second corner regions 360 and 370 through a p-type impurity ion implantation process. Thereafter, the internal field rings 380 may be formed in the first and second corner regions 360 and 370 through an n-type impurity ion implantation process and a p-type impurity ion implantation process.

In embodiments, the internal field rings 380 may be coupled to each other in a honeycomb structure and formed below the field oxide film 350.

As described above, the internal field rings 380 may be formed between the source fingertip 310t and the drain 320 and between the drain fingertip 320t and the source 310. Therefore, it is possible to increase the breakdown voltage without causing an increase in the radius of curvature between the source fingertip 310t and the drain 320 and between the drain fingertip 320t and the source 310.

A process of forming the internal field rings will be described with reference to example FIGS. 8A to 8D.

Example FIGS. 8A to 8D are process sectional views illustrating a process of forming internal field rings according to embodiments.

Figure 8A:

As illustrated in example FIG. 8A, first, a high-concentration n-type impurity ion implantation process is performed to form the N drift region 340 of the LDMOS device in the p-type substrate or the p-type SOI substrate 300. Specifically, an ion implantation mask in which the portion where the N drift region 340 will be formed, that is, where the strip portion is exposed, is formed on the substrate 300, and a high-concentration n-type impurity ion implantation process is performed to form the N drift region 340 in the substrate 300. The strip region may mean the portion excluding the portion where the field oxide film 350 will be formed, that is, the portion excluding the first and second corner regions 360 and 370.

Figure 8B:
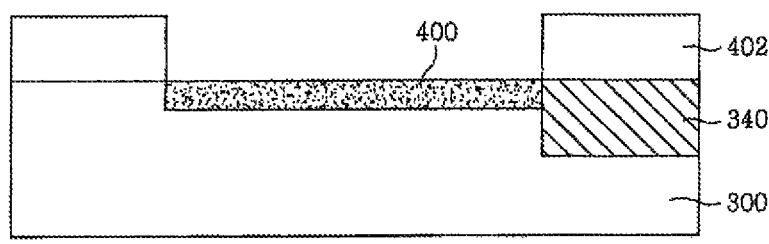

Next, as illustrated in example FIG. 8B, a first ion implantation mask 402 in which the portions excluding the N drift region 340, that is, the first and second corner regions 360 and 370 are exposed is formed, and a p-type impurity ion implantation process is performed using the first ion implantation mask 402 to form the P top region 400.

Figure 8C:
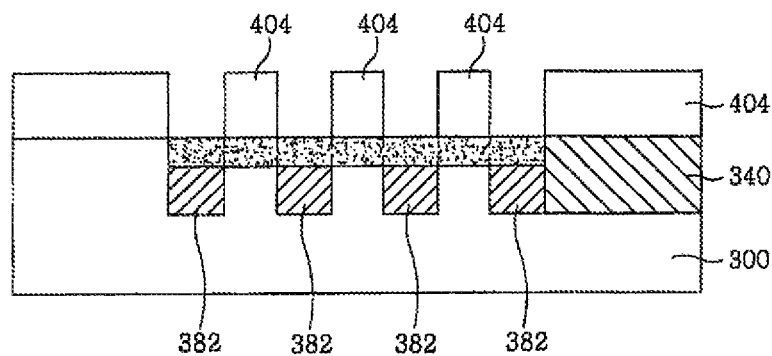

Next, as illustrated in example FIG. 8C, after the first ion implantation mask 402 is removed, a second ion implantation mask 404 in which a portion excluding the N drift region 340, that is, a portion of the first and second corner regions 360 and 370 is exposed is formed, and a high-concentration n-type impurity ion implantation process is then performed using the second ion implantation mask 404 to form the n-type first internal rings 382. The first internal rings 382 are formed in the first and second corner regions 360 and 370 and are coupled to each other in an octagonal shape.

Figure 8D:
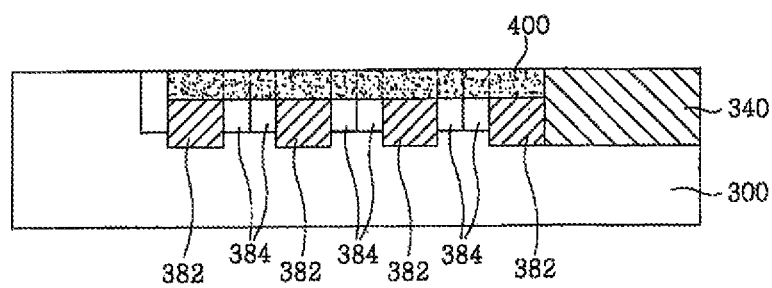

Next, as illustrated in example FIG. 8D, after the second ion implantation mask 404 is removed, a third ion implantation mask in which another portion of the first and second corner regions 360 and 370 is exposed is formed, and a high-concentration p-type impurity ion implantation process is then performed using the third ion implantation mask to form the p-type second internal rings 384. Thereafter, the third ion implantation mask is removed. The second internal rings 384 are formed inside the first internal rings 382 to have an octagonal shape, similarly to the first internal rings 382.

The breakdown voltage of the LDMOS device according with embodiments can be controlled by adjusting the depth and width of the second internal rings 384 inside the internal field rings 380. The depth and width of the second internal rings 384 can be adjusted by adjusting the ion implantation amount and ion implantation energy in the p-type impurity ion implantation process.

In accordance with embodiments, the n-type and p-type ion implantation processes are performed in the corner regions 360 and 370 between the source fingertip 310t and the drain 320 and between the drain fingertip 320t and the source 310 to form n type and p-type first and second internal rings 382 and 384, such that the electric field is arranged in the current direction and the width direction, thereby increasing on-resistance and breakdown voltage.

Although in embodiments, examples have been described where the internal field rings 380 have the octagonal shape, the internal field rings may be formed to have various shapes, such as circle, rectangle, and/or triangle.

While the invention has been shown and described with respect to embodiments, it will be understood by those skilled in the art that various changes and modifications may be made without departing from the scope of the invention as defined in the following claims.

What is claimed is:

1. An apparatus comprising:
a gate formed over a substrate;
a source and a drain which are separately arranged on respective sides of the substrate with the gate interposed therebetween;
a field oxide film formed between the gate and the drain;
a drift region formed between the gate and the drain using first condition type impurity ions;
a plurality of internal field rings, coupled to each other, and formed of the first condition type impurity ions and second condition type impurity ions inside a corner region having a fingertip of the source and a fingertip of the drain, wherein each of the internal field rings includes a region formed of the second condition type impurity ions inside a region formed of the first condition type impurity ions; and
a top region formed of the second condition type impurity ions below the field oxide film, wherein the plurality of internal field rings are formed below the top region.

2. The apparatus of claim 1,
wherein a concentration of the corner region is determined by a number of the plurality of internal field rings.

3. The apparatus of claim 1,
wherein a concentration of the corner region is determined by an ion implantation amount or implantation energy of the second conduction type impurity ions for forming the plurality of internal field rings.

4. The apparatus of claim 1,
wherein the plurality of internal field rings comprise:
a plurality of first internal rings which are formed of the first condition type impurity ions and are coupled to each other in a polygonal shape, and
a plurality of second internal rings which are respectively formed inside the plurality of first internal rings and are formed of the second condition type impurity ions to have a polygonal shape.

5. The apparatus of claim 1, wherein the plurality of internal field rings are formed in a first region of the corner region between the fingertip of the source and the drain, and in a second region of the corner region between the fingertip of the drain and the source.

6. The apparatus of claim 1, wherein each one of the plurality internal field rings comprises a first internal ring and a second internal ring.

7. The apparatus of claim 6, wherein the second internal ring is formed within the circumference of the first internal ring.

8. The apparatus of claim 7, wherein the first internal ring and the second internal ring are formed in a shape of a polygon.

9. The apparatus of claim 6, wherein the first internal ring and the second internal ring are formed in a shape of a polygon.

10. The apparatus of claim 6, wherein the second internal ring is formed within the circumference of the first internal ring in each one of the plurality of internal field rings.

11. The apparatus of claim 6, wherein the first internal ring and the second internal ring are formed in a shape of a polygon.

12. The apparatus of claim 1, wherein the first condition type impurity ions comprise n-type impurity ions, and the second condition type impurity ions comprise p-type impurity ions.

13. The apparatus of claim 1, wherein the apparatus forms a laterally diffused metal oxide semiconductor (LDMOS) transistor device.

14. An apparatus comprising:
a source formed over a substrate and having a source fingertip portion;
a drain formed over the substrate and having a source fingertip portion;
a gate formed over the substrate at a location between the source and the drain;
a field oxide film formed between the gate and the drain;
a plurality of internal field rings formed in a first corner region between the source fingertip portion and the drain and in a second corner region between the drain fingertip portion and the source; and
a top region formed of a second condition type impurity ions below the field oxide film, wherein the plurality of internal field rings are formed below the top region.

15. The apparatus of claim 14, wherein each one of the plurality of internal field rings comprises a first internal ring formed of first condition type impurity ions and a second internal ring formed of second condition type impurity ions, wherein the second internal ring is formed within the circumference of the first internal ring.

16. A method for manufacturing an apparatus which has a source and a drain separately arranged on respective sides of a substrate with a gate interposed therebetween, the method comprising:
implanting first condition type impurity ions on the substrate corresponding to a strip region that excludes a corner region having a fingertip of the source and a fingertip of the drain to form a drift region;
forming a field oxide film on the substrate corresponding to the corner region; and
implanting the first condition type impurity ions and second condition type impurity ions in the corner region to form a plurality of internal field rings coupled to each other, wherein each of the internal field rings includes a region formed of the second conduction type impurity ions inside a region formed of the first conduction type impurity ions
forming a top region formed of the second condition type impurity ions below the field oxide film, wherein the plurality of internal field rings are formed below the top region.

17. The method of claim 16, further comprising:
prior to forming the plurality of internal field rings, implanting the second condition type impurity ions below the field oxide film to form a top region,
wherein the plurality of internal field rings is formed below the top region.

18. The method of claim 16,
wherein the forming the plurality of internal field rings comprises:
implanting the first condition type impurity ions using an ion implantation mask, in which a portion of the corner region is exposed, to form a plurality of first internal rings coupled to each other in a polygonal shape; and
implanting the second condition type impurity ions using an ion implantation mask, in which another portion of the corner region is exposed, to form a plurality of second internal rings in a polygonal shape inside the first internal rings.

19. The method of claim 18,
wherein, in said forming the first plurality of internal rings, the first plurality of internal rings may be formed to have a hexagonal shape and coupled to each other in a honeycomb structure.

* * * * *